United States Patent
Park et al.

(10) Patent No.: US 10,008,633 B2
(45) Date of Patent: Jun. 26, 2018

(54) LIGHT-EMITTING DIODE AND LIGHTING SYSTEM

(71) Applicant: LG INNOTEK CO., LTD., Seoul (KR)

(72) Inventors: Chan Keun Park, Seoul (KR); Hwan Hee Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days. days.

(21) Appl. No.: 15/501,321

(22) PCT Filed: Jul. 22, 2015

(86) PCT No.: PCT/KR2015/007589
§ 371 (c)(1),
(2) Date: Feb. 2, 2017

(87) PCT Pub. No.: WO2016/021853
PCT Pub. Date: Feb. 11, 2016

(65) Prior Publication Data
US 2017/0222089 A1 Aug. 3, 2017

(30) Foreign Application Priority Data
Aug. 4, 2014 (KR) .................. 10-2014-0099925

(51) Int. Cl.
*H01L 33/22* (2010.01)
*H01L 33/32* (2010.01)
(Continued)

(52) U.S. Cl.
CPC .............. *H01L 33/22* (2013.01); *H01L 33/06* (2013.01); *H01L 33/32* (2013.01); *H01L 33/36* (2013.01); *H01L 33/38* (2013.01)

(58) Field of Classification Search
CPC ......... H01L 33/22; H01L 33/38; H01L 33/32; H01L 33/06; H01L 33/36
(Continued)

(56) References Cited

U.S. PATENT DOCUMENTS 8,865,565 B2    10/2014  Chen
9,041,032 B2     5/2015  Choi et al.
(Continued)

FOREIGN PATENT DOCUMENTS

JP  2007-281037       10/2007
KR  10-2006-0103619   10/2004
(Continued)

OTHER PUBLICATIONS

International Search Report (with English Translation) and Written Opinion dated Nov. 17, 2015 issued in Application No. PCT/KR2015/007589.

*Primary Examiner* — Caleen Sullivan
(74) *Attorney, Agent, or Firm* — KED & Associates, LLP (57) ABSTRACT

Disclosed are a light emitting diode and a lighting system having the same. The light emitting diode according to an embodiment may include a first electrode having a plurality of patterns formed on an upper surface thereof; a texture structure having a plurality of patterns corresponding to the plurality of patterns of the first electrode and configured to be in contact with at least one of the plurality of patterns of the first electrode; a first conductive semiconductor layer disposed on the texture structure; an active layer disposed on the first conductive semiconductor layer; a second conductive semiconductor layer disposed on the active layer; and a second electrode disposed on the second conductive semiconductor layer.

20 Claims, 4 Drawing Sheets

(51) Int. Cl.
*H01L 33/06* (2010.01)
*H01L 33/38* (2010.01)
*H01L 33/36* (2010.01)

(58) Field of Classification Search
USPC .......................................................... 257/91
See application file for complete search history.

(56) References Cited

U.S. PATENT DOCUMENTS

2010/0219434 A1* 9/2010 Kim ..................... H01L 33/20
257/98
2013/0009130 A1 1/2013 Chen et al.
2014/0061711 A1* 3/2014 Yokoyama .............. H01L 33/38
257/99

FOREIGN PATENT DOCUMENTS

| KR | 10-2010-0054594 | 5/2010 |
| KR | 10-2012-0135057 | 12/2012 |
| KR | 10-2012-0138275 | 12/2012 |
| KR | 10-2014-0018985 | 2/2014 |

* cited by examiner

FIG. 8

LIGHT-EMITTING DIODE AND LIGHTING SYSTEM

CROSS-REFERENCE TO RELATED PATENT APPLICATIONS

This application is a U.S. National Stage Application under 35 U.S.C. § 371 of PCT Application No. PCT/KR2015/007589, filed Jul. 22, 2015, which claims priority to Korean Patent Application No. 10-2014-0099925, filed Aug. 4, 2014, whose entire disclosures are hereby incorporated by reference.

TECHNICAL FIELD

The present invention relates to a light emitting diode, a manufacturing method of the light emitting diode, a light emitting diode package and a lighting system.

BACKGROUND ART

A light emitting diode is a p-n junction diode having a characteristic in which electric energy is converted into light energy, may be configured with a compound semiconductor of Group III and Group V elements or the like on the periodic table and may represent various colors by adjusting a composition ratio of the compound semiconductor.

In the light emitting diode, when a forward voltage is applied, electrons of an n layer are combined with holes of a p layer, and energy corresponding to an energy gap between a conduction band and a valance band may be generated, and the energy is emitted in the form of light.

A nitride semiconductor is receiving a lot of attention in an optical device and a high-output electronic device development field due to high thermal stability and wide band gap energy thereof. In particular, a blue light emitting diode, a green light emitting diode and an UV light emitting diode using the nitride semiconductor are commercialized and used widely.

The light emitting diode may be classified into a lateral type and a vertical type according to a position of an electrode thereof.

In a conventional vertical type light emitting diode, when a growth substrate is removed and an electrode is connected, an operating voltage VF or an optical loss Po may be affected according to a composition of a semiconductor layer which is in contact with the electrode.

DISCLOSURE

Technical Problem

The present invention is directed to providing a light emitting diode having an improved operating voltage by connecting a texture structure having a predetermined pattern with an electrode, and a lighting system having the same.

Also, the present invention is directed to providing a light emitting diode having an improved yield by promoting electron spreading through a texture structure including a superlattice layer, and a lighting system having the same.

Technical Solution

One aspect of the present invention provides a light emitting diode including a first electrode having a plurality of patterns formed on an upper surface thereof; a texture structure having a plurality of patterns corresponding to the plurality of patterns of the first electrode and configured to be in contact with at least one of the plurality of patterns of the first electrode; a first conductive semiconductor layer disposed on the texture structure; an active layer disposed on the first conductive semiconductor layer; a second conductive semiconductor layer disposed on the active layer; and a second electrode disposed on the second conductive semiconductor layer.

Another aspect of the present invention provides a lighting system including a light emitting module having the light emitting diode.

Advantageous Effects

In the light emitting diode according the embodiment, the operating voltage can be reduced by connecting the texture structure having the predetermined pattern with the electrode.

Also, in the embodiment, the yield and reliability and thus the optical loss can be improved by promoting the electron spreading through the texture structure including the superlattice layer.

Also, the embodiment can reduce generation of a crack by preventing a dislocation through the texture structure having the superlattice structure and controlling a strain.

Also, the embodiment can constantly keep the optical loss Po and the operating voltage VF3 in a wafer during a process.

MODES OF THE INVENTION

In the description of embodiments, it will be understood that when a layer (or film), region, pattern or structure is referred to as being "on/over" or "under" another layer (or film), region, pattern or structure, the terminology of "on/over" and "under" includes both the meanings of "directly" or "by interposing another layer (indirectly)". Further, the reference about "on/over" and "under" each layer will be made on the basis of drawings.

Figure 1:
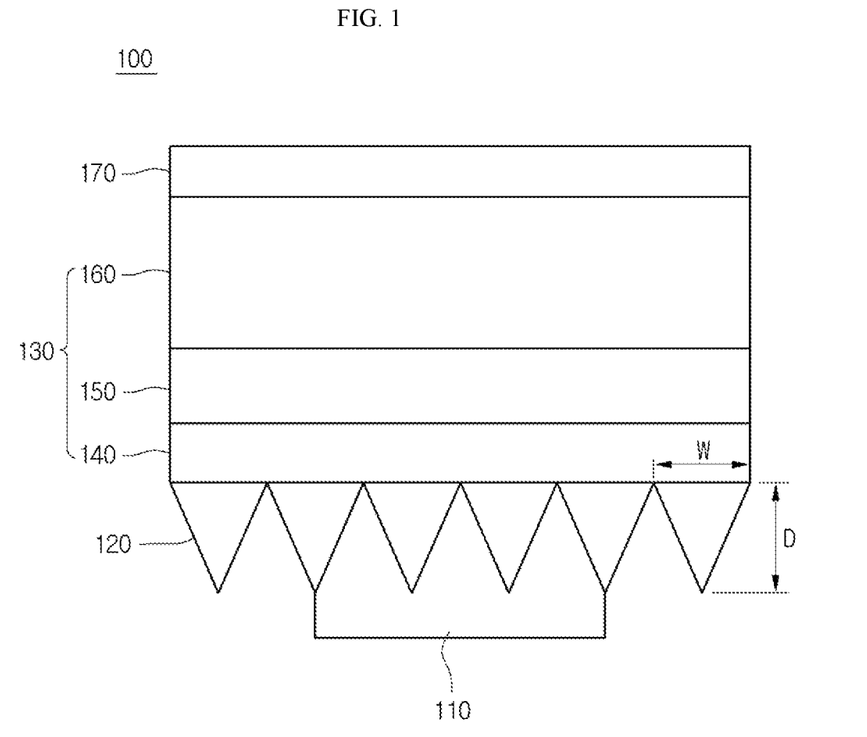
FIG. 1 is a cross-sectional view of a light emitting diode according to an embodiment.

FIG. 1 is a cross-sectional view of a light emitting diode 100 according to an embodiment.

The light emitting diode 100 according to the embodiment may include a first electrode 110 having a plurality of patterns, a texture structure 120 having a plurality of patterns corresponding to the plurality of patterns of the first electrode 110, a light emitting structure 130 disposed on the texture structure 120 and a second electrode 170 disposed on the light emitting structure 130. The light emitting structure 130 may include a first conductive semiconductor layer 140, an active layer 150 disposed on the first conductive semiconductor layer 140, and a second conductive semiconductor layer 160 disposed on the active layer 150.

The first electrode 110 may include the plurality of patterns, and each of the plurality of patterns may have at least one of a triangular shape, a square shape and a trapezoidal shape but is not limited thereto.

In the embodiment, when each of the plurality of patterns of the first electrode 110 has the triangular shape, a width W of each of the patterns may be within a range of 300 nm or more and 1500 nm or less, and a depth D of each of the patterns may be within a range of 300 nm or more and 1500 nm or less.

In the embodiment, the texture structure 120 may include the plurality of patterns corresponding to the plurality of patterns of the first electrode 110.

In the embodiment, the texture structure 120 may include at least one of an aluminum gallium nitride layer and a gallium nitride layer and may include a superlattice layer in which the aluminum gallium nitride layer and the gallium nitride layer are stacked repeatedly.

Also, in the embodiment, a thickness of the texture structure 120 may be within a range of 300 nm or more and 1500 nm or less. According to the embodiment, the thickness of the texture structure 120 may be 1000 nm. When the thickness of the texture structure 120 is less than 300 nm, the patterns may be formed to an inside of the first conductive semiconductor layer 140 in an etching process for forming the plurality of patterns, and an operating voltage may be increased. Also, when the thickness of the texture structure 120 is more than 1500 nm, the gallium nitride layer may come in contact with the first electrode 110 and thus an optical loss may occur.

In the embodiment, a thickness of the aluminum gallium nitride layer may be smaller than that of the gallium nitride layer. Also, the thickness of the aluminum gallium nitride layer may be equal to that of the gallium nitride layer according to the embodiment.

In the embodiment, each of the aluminum gallium nitride layer and the gallium nitride layer may have a thickness of 1 nm or more and 10 nm or less. When the thickness of each of the aluminum gallium nitride layer and the gallium nitride layer may is more than 10 nm, an effect of blocking a dislocation and controlling a crack may be lowered.

In the embodiment, a composition ratio of aluminum in the aluminum gallium nitride layer may be 2% or more and 15% or less. When the composition ratio of the aluminum in the aluminum gallium nitride layer is less than 2%, the optical loss may sharply occur, and when the composition ratio of the aluminum is more than 15%, the operating voltage VF may be sharply increased.

A width and a depth of each of the plurality of patterns of the texture structure 120 may be equal to the width and the depth of each of the plurality of patterns of the first electrode 110.

Both side ends of each of the plurality of patterns of the texture structure 120 may be overlapped with those of each of the plurality of patterns of the first electrode 110.

That is, the first electrode 110 may be simultaneously in contact with the aluminum gallium nitride layer and the gallium nitride layer. In the light emitting diode according to the embodiment, when the thickness of the gallium nitride layer is greater than that of the aluminum gallium nitride layer, the operating voltage VF may be reduced. For example, the light emitting diode according to the embodiment, the operating voltage VF may be reduced from 3.57 V to 3.52 V.

According to the embodiment, the plurality of patterns of the first electrode 110 may be in contact with the first conductive semiconductor layer 140.

According to the embodiment, the first conductive semiconductor layer 140 may be configured with an n-type semiconductor layer in which an n-type dopant as a first conductive dopant is added, and the second conductive semiconductor layer 160 may be configured with a p-type semiconductor layer in which a p-type dopant as a second conductive dopant is added. Also, the first conductive semiconductor layer 140 may be configured with the p-type semiconductor layer, and the second conductive semiconductor layer 160 may be configured with the n-type semiconductor layer.

The first conductive semiconductor layer 140 may include, for example, the n-type semiconductor layer. The first conductive semiconductor layer 140 may be realized with a compound semiconductor. The first conductive semiconductor layer 140 may be realized with a Group II-VI compound semiconductor or a Group III-V compound semiconductor as an example.

For example, the first conductive semiconductor layer 140 may be realized with a semiconductor material having a composition formula of $In_xAl_yGa_{1-x-y}N$ ($0 \leq x \leq 1$, $0 \leq y \leq 1$, $0 \leq x+y \leq 1$). The first conductive semiconductor layer 140 may be selected from GaN, AlN, AlGaN, InGaN, InN, InAlGaN, AlInN, AlGaAs, GaP, GaAs, GaAsP, AlGaInP and so on, and may be doped with the n-type dopant such as Si, Ge, Sn, Se and Te.

The active layer 150 is a layer at which electrons (or holes) injected through the first conductive semiconductor layer 140 encounters holes (or electrons) injected through the second conductive semiconductor layer 160 and light is emitted by a band gap difference of an energy band according to a formative material of the active layer 150. The active layer 150 may be formed in one of a single well structure, a multi-well structure, a quantum dot structure and a quantum wire structure, but is not limited thereto.

The active layer 150 may be realized with the compound semiconductor. The active layer 150 may be realized with, for example, the Group II-VI compound semiconductor or the Group III-V compound semiconductor as an example. The active layer 150 may be realized with a semiconductor material having the composition formula of $In_xAl_yGa_{1-x-y}N$ ($0 \leq x \leq 1$, $0 \leq y \leq 1$, $0 \leq x+y \leq 1$). When the active layer 150 is formed in the multi-well structure, the active layer 150 may be realized by stacking a plurality of well layers and a plurality of barrier layers. For example, the active layer 150 may be realized with a period of a InGaN well layer/a GaN barrier layer.

The second conductive semiconductor layer 160 may be realized with, for example, the p-type semiconductor layer. The second conductive semiconductor layer 160 may be realized with a compound semiconductor. The second conductive semiconductor layer 160 may be realized with, for example, the Group II-VI compound semiconductor or the Group III-V compound semiconductor as an example.

For example, the second conductive semiconductor layer 160 may be realized with a semiconductor material having the composition formula of $In_xAl_yGa_{1-x-y}N$ ($0 \leq x \leq 1$, $0 \leq y \leq 1$, $0 \leq x+y \leq 1$). The second conductive semiconductor layer 160 may be selected from GaN, AlN, AlGaN, InGaN, InN, InAlGaN, AlInN, AlGaAs, GaP, GaAs, GaAsP, AlGaInP and so on, and may be doped with the p-type dopant such as Mg, Zn, Ca, Sr and Ba.

Meanwhile, the first conductive semiconductor layer 140 may include the p-type semiconductor layer, and the second conductive semiconductor layer 160 may include the n-type semiconductor layer. Also, a semiconductor layer including the n-type or p-type semiconductor layer may be further formed under the second conductive semiconductor layer 160. Therefore, the light emitting structure 130 may have at least one of np, pn, npn and pnp junction structures. Also, a doping concentration of impurities in the first conductive semiconductor layer 140 and the second conductive semiconductor layer 160 may be uniformly or non-uniformly formed. That is, a structure of the light emitting structure 130 may be formed variously and is not limited.

Also, a first conductive InGaN/GaN superlattice structure or InGaN/InGaN superlattice structure may be formed between the first conductive semiconductor layer 140 and the active layer 150. Also, a second conductive AlGaN layer may be formed between the second conductive semiconductor layer 160 and the active layer 150.

According to the embodiment, the active layer 150 may emit ultraviolet light within a range of 360 nm or more and 400 nm or less.

The second electrode 170 may be formed on the second conductive semiconductor layer 160. The second electrode 170 is in ohmic contact with the second conductive semiconductor layer 160, may include at least one conductive material and may be formed with a single layer or multiple layers. For example, the second electrode 170 may include at least one of a metallic material, a metallic oxide material and a metallic nitride material.

Figure 2:
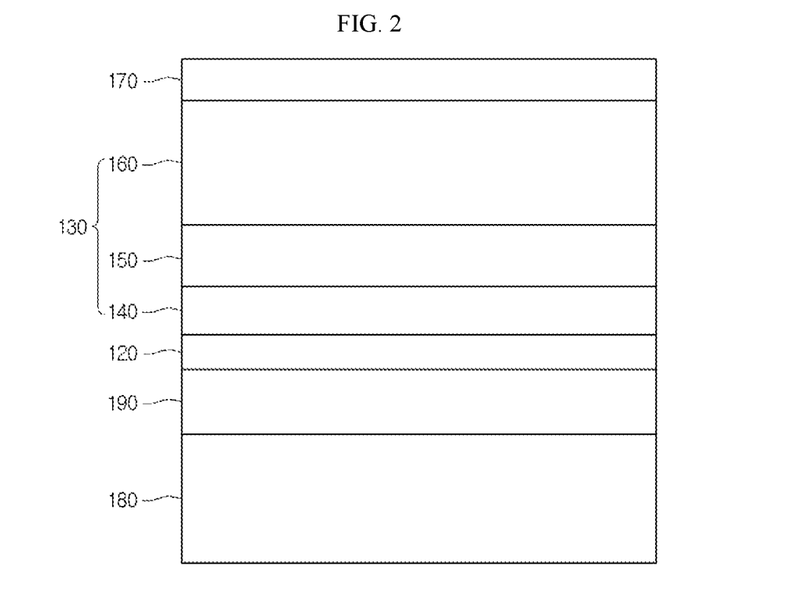
FIGS. 2 to 4 are process cross-sectional views of a manufacturing method of the light emitting diode according to an embodiment.
Figure 3:
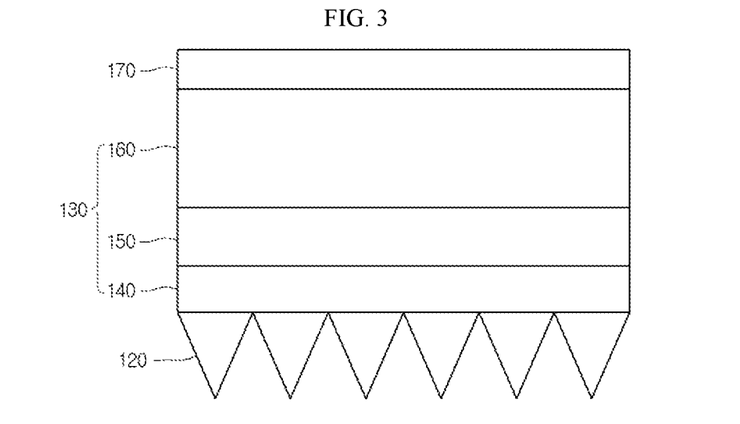
Figure 4:
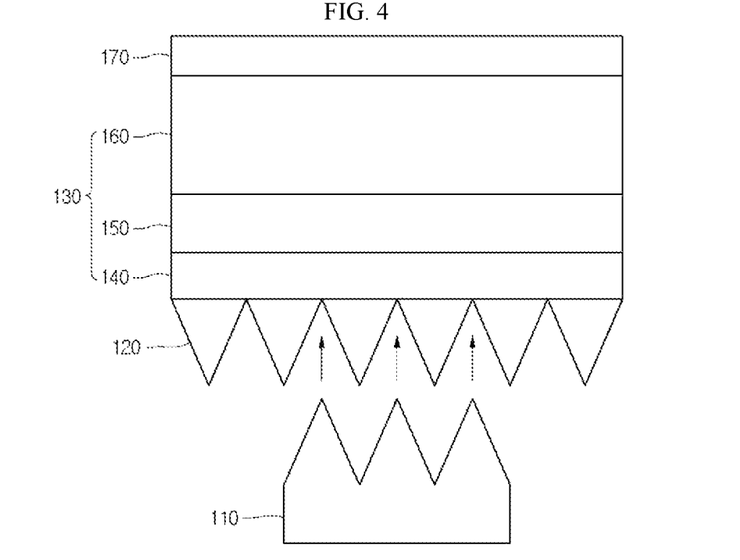

FIGS. 2 to 4 are process cross-sectional views of a manufacturing method of the light emitting diode according to an embodiment.

Hereinafter, the characteristic of the present invention will be described while the manufacturing method of the light emitting diode according to an embodiment is described with reference to FIGS. 2 to 4.

Referring to FIG. 2, a lower first conductive semiconductor layer 190, the texture structure 120, an upper first conductive semiconductor layer 140, the active layer 150, the second conductive semiconductor layer 160 and the second electrode 170 may be included on a growth substrate 180.

The growth substrate 180 may be loaded at growth equipment and may be formed thereon in the form of a layer or a pattern using a compound semiconductor of Group II to VI elements.

An electron beam evaporator, a physical vapor deposition (PVD), a chemical vapor deposition (CVD), a plasma laser deposition (PLD), a dual-type thermal evaporator, a sputtering, a metal organic chemical vapor deposition (MOCVD) or the like may be employed in the growth equipment, but the growth equipment is not limited thereto.

The growth substrate 180 may be a conductive substrate or an insulating substrate. For example, the growth substrate 180 may be selected from the group consisting of a sapphire substrate ($Al_2O_3$), GaN, SiC, ZnO, Si, GaP, InP, $Ga_2O_3$, GaAs and so on.

A buffer layer (not shown) may be formed on the growth substrate 180. The buffer layer serves to reduce a difference in a lattice constant between the growth substrate 180 and a nitride semiconductor, and a material thereof may be selected from GaN, AlN, AlGaN, InGaN, InN, InAlGaN, AlInN, AlGaAs, GaP, GaAs, GaAsP, AlGaInP and so on.

An undoped semiconductor layer (not shown) may be formed on the buffer layer. The undoped semiconductor layer may be formed of an undoped GaN-based semiconductor and may be formed of a lower conductive semiconductor layer further than the n-type semiconductor layer.

Then, the lower first conductive semiconductor layer 190 may be formed on the buffer layer or the undoped semiconductor layer, and the texture structure 120 may be formed on the lower first conductive semiconductor layer 190, and the upper first conductive semiconductor layer 140 may be formed in turn.

Each of the lower first conductive semiconductor layer 190 and the upper first conductive semiconductor layer 140 may be the Group III-V compound semiconductor doped with a first conductive dopant and may be selected from, for example, GaN, AlN, AlGaN, InGaN, InN, InAlGaN, AlInN, AlGaAsm GaP, GaAs, GaAsP, AlGaInP and so on.

According to the embodiment, the lower first conductive semiconductor layer 190 may be formed of a semiconductor layer having a composition formula of GaN, and the upper first conductive semiconductor layer 140 may be formed of a semiconductor layer having a composition formula of AlGaN.

The lower first conductive semiconductor layer 190 and the upper first conductive semiconductor layer 140 may be n-type semiconductor layers, and the first conductive dopant may include an n-type dopant such as St, Ge, Sn, Se, Te and so on.

The texture structure 120 may be disposed between the lower first conductive semiconductor layer 190 and the upper first conductive semiconductor layer 140 and may include a superlattice structure in which two different layers of GaN, AlN, AlGaN, InGaN, InN, InAlGaN, AlGaAs, GaP, GaAs, GaAsP, AlGaInP and so on are alternately arranged.

The active layer 150 may include a single quantum well structure, a multi-quantum well structure, a quantum wire structure or a quantum dot structure. The active layer 150 may be formed with a period of a well layer and a barrier layer using the Group III-V compound semiconductor material. The well layer may include a semiconductor layer having the composition formula of $In_xAl_yGa_{1-x-y}N$ ($0 \leq x \leq 1$, $0 \leq y \leq 1$, $0 \leq x+y \leq 1$), and the barrier layer may be formed of a semiconductor layer having the composition formula of $In_xAl_yGa_{1-x-y}N$ ($0 \leq x \leq 1$, $0 \leq y \leq 1$, $0 \leq x+y \leq 1$). The barrier layer may be formed of a material having a higher band gap than that of the well layer.

The active layer 150 may include at least one of a period of an InGaN well layer/a GaN barrier layer, a period of an InGaN well layer/an AlGaN barrier layer and a period of an InGaN well layer/an InGaN barrier layer.

The second conductive semiconductor layer 160 is formed on the active layer 150. The second conductive semiconductor layer 160 may be the Group III-V compound semiconductor doped with a second conductive dopant and may be selected from, for example, GaN, AlN, AlGaN, InGaN, InN, InAlGaN, AlInN, AlGaAs, GaP, GaAs, GaAsP, AlGaInP and so on. The second conductive semiconductor layer 160 may be formed of a semiconductor layer having the composition formula of $In_xAl_yGa_{1-x-y}N$ ($0 \leq x \leq 1$, $0 \leq y \leq 1$, $0 \leq x+y \leq 1$).

The second conductive semiconductor layer 160 may be the p-type semiconductor layer, and the second conductive dopant includes a p-type dopant such as Mg and Zn. The second conductive semiconductor layer 160 may be formed in a single layer or multiple layers but is not limited thereto.

The second conductive semiconductor layer 160 may include the superlattice structure in which two different layers of GaN, AlN, AlGaN, InGaN, InN, InAlGaN, AlInN, AlGaAs, GaP, GaAs, GaAsP, AlGaInP and so on are alternately arranged. According to the embodiment, a third conductive semiconductor layer (not shown), e.g., a semiconductor layer having a polarity opposite to that of the second conductive semiconductor layer 160 may be formed on the second conductive semiconductor layer 160.

The second electrode 170 may include at least one conductive material and may be formed in a single layer or multiple layers. For example, the second electrode 170 may include at least one of a metallic material, a metallic oxide material and a metallic nitride material.

Referring to FIG. 3, a process in which the growth substrate 180 and the lower first conductive semiconductor layer 190 are removed and the texture structure 120 is etched to have a plurality of predetermined patterns may be performed.

For example, each of the plurality of patterns may be etched in a triangular shape, and a height and a width of each of the plurality of patterns may be associated with a thickness of the texture structure 120.

Referring to FIG. 4, the first electrode 110 may be etched to have a plurality of patterns corresponding to the plurality of patterns of the texture structure 120. The first electrode 110 treated by the etching process may be in contact with the texture structure 120 treated by the etching process to be overlapped with each other. That is, the first electrode 110 is overlapped with the texture structure 120 including at least one of the aluminum gallium nitride layer and the gallium nitride layer and thus may be in contact with at least one of the aluminum gallium nitride layer and the gallium nitride layer.

Figure 5:
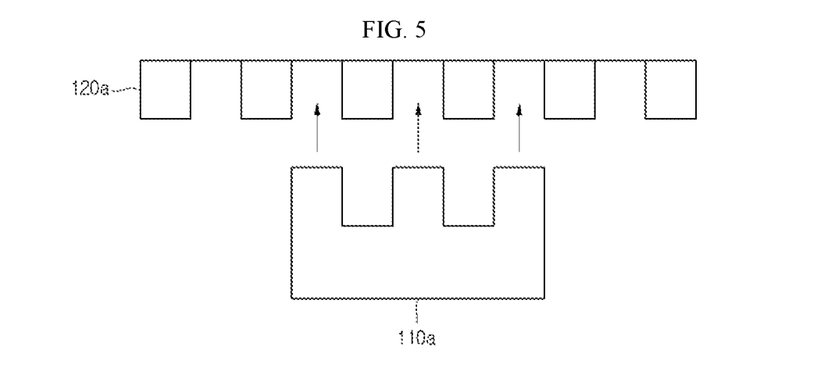
FIG. 5 is a cross-sectional view of a light emitting diode according to another embodiment.

FIG. 5 is a cross-sectional view of a light emitting diode according to another embodiment. FIG. 5 is a modified embodiment in which the light emitting diode of FIGS. 1 to 4 is partially modified.

In the embodiment, a first electrode 110a may include a plurality of patterns, and each of the plurality of patterns may be formed in a square shape.

In the embodiment, when each of the plurality of patterns of the first electrode 110a is formed in the square shape, a width of each of the plurality of patterns may be within a range of 300 nm or more and 1500 nm or less, and a depth thereof may be within a range of 300 nm or more and 1500 nm or less.

In the embodiment, a texture structure 120a may include a plurality of patterns corresponding to the plurality of patterns of the first electrode 110a.

A width and a depth of each of the plurality of patterns of the texture structure 120a may be equal to the width and the depth of each of the plurality of patterns of the first electrode 110a.

Both side ends of each of the plurality of patterns of the texture structure 120a may be overlapped with those of each of the plurality of patterns of the first electrode 110a.

In the embodiment, the texture structure 120a may include at least one of an aluminum gallium nitride layer and a gallium nitride layer and may include a superlattice layer in which the aluminum gallium nitride layer and the gallium nitride layer are stacked repeatedly.

Also, in the embodiment, a thickness of the texture structure 120a may be within a range of 300 nm or more and 1500 nm or less. According to the embodiment, the thickness of the texture structure 120a may be 1000 nm.

In the embodiment, a thickness of the aluminum gallium nitride layer may be smaller than that of the gallium nitride layer. Also, the thickness of the aluminum gallium nitride layer may be equal to that of the gallium nitride layer according to the embodiment.

In the embodiment, each of the aluminum gallium nitride layer and the gallium nitride layer may have a thickness of 1 nm or more and 10 nm or less.

In the embodiment, a composition ratio of aluminum in the aluminum gallium nitride layer may be 2% or more and 15% or less. When the composition ratio of the aluminum in the aluminum gallium nitride layer is less than 2%, the optical loss may sharply occur, and when the composition ratio of the aluminum is more than 15%, the operating voltage VF may be sharply increased.

A width and a depth of each of the plurality of patterns of the texture structure 120a may be equal to the width and the depth of each of the plurality of patterns of the first electrode 110a.

Both side ends of each of the plurality of patterns of the texture structure 120a may be overlapped with those of each of the plurality of patterns of the first electrode 110a.

That is, the first electrode 110a may be simultaneously in contact with the aluminum gallium nitride layer and the gallium nitride layer. In the light emitting diode according to the embodiment, when the thickness of the gallium nitride layer is greater than that of the aluminum gallium nitride layer, the operating voltage VF may be reduced.

Figure 6:
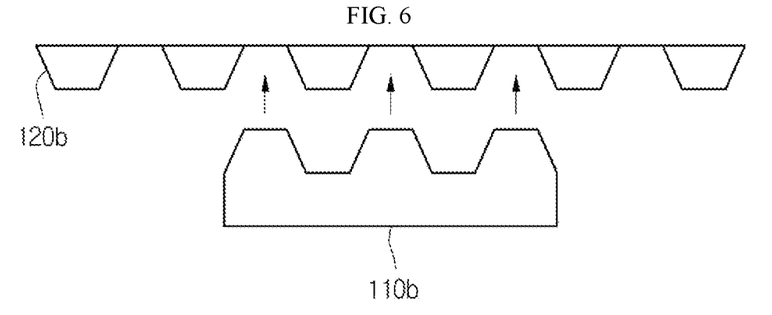
FIG. 6 is a cross-sectional view of a light emitting diode according to yet another embodiment.

FIG. 6 is a cross-sectional view of a light emitting diode according to yet another embodiment. FIG. 6 is a modified embodiment in which the light emitting diode of FIGS. 1 to 4 is partially modified.

In the embodiment, a first electrode 110b may include a plurality of patterns, and each of the plurality of patterns may be formed in a trapezoidal shape.

In the embodiment, when each of the plurality of patterns of the first electrode 110b is formed in the trapezoidal shape, a width of an upper surface of each of the plurality of patterns may be within a range of 300 nm or more and 1500 nm or less, and a depth thereof may be within a range of 300 nm or more and 1500 nm or less.

In the embodiment, a texture structure 120b may include a plurality of patterns corresponding to the plurality of patterns of the first electrode 110b.

A width and a depth of each of the plurality of patterns of the texture structure 120b may be equal to the width and the depth of each of the plurality of patterns of the first electrode 110b.

Both side ends of each of the plurality of patterns of the texture structure 120b may be overlapped with those of each of the plurality of patterns of the first electrode 110b.

In the embodiment, the texture structure 120b may include at least one of an aluminum gallium nitride layer and a gallium nitride layer and may include a superlattice layer in which the aluminum gallium nitride layer and the gallium nitride layer are stacked repeatedly.

Also, in the embodiment, a thickness of the texture structure 120b may be within a range of 300 nm or more and 1500 nm or less. According to the embodiment, the thickness of the texture structure 120b may be 1000 nm.

In the embodiment, a thickness of the aluminum gallium nitride layer may be smaller than that of the gallium nitride layer. Also, the thickness of the aluminum gallium nitride layer may be equal to that of the gallium nitride layer according to the embodiment.

In the embodiment, each of the aluminum gallium nitride layer and the gallium nitride layer may have a thickness of 1 nm or more and 10 nm or less, and a composition ratio of aluminum in the aluminum gallium nitride layer may be 2% or more and 15% or less. When the composition ratio of the aluminum in the aluminum gallium nitride layer is less than 2%, the optical loss may sharply occur, and when the composition ratio of the aluminum is more than 15%, the operating voltage VF may be sharply increased.

That is, the first electrode 110b may be simultaneously in contact with the aluminum gallium nitride layer and the gallium nitride layer. In the light emitting diode according to the embodiment, when the thickness of the gallium nitride layer is greater than that of the aluminum gallium nitride layer, the operating voltage VF may be reduced.

Figure 7:
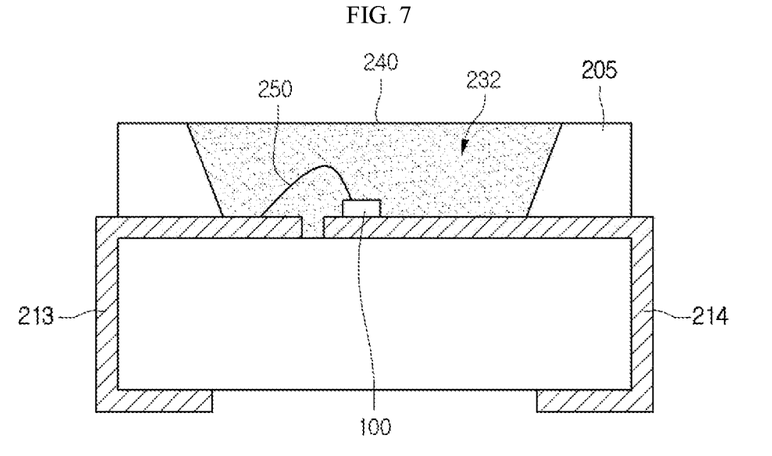
FIG. 7 is a cross-sectional view of a light emitting diode package according to the embodiment.

FIG. 7 is a view of a light emitting diode package to which the light emitting diode according to the embodiment is applied.

Referring to FIG. 7, the light emitting diode package according to the embodiment may include a body 205, a first lead electrode 213 and a second lead electrode 214 disposed at the body 205, the light emitting diode 100 provided at the body 205 to be electrically connected with the first lead electrode 213 and the second lead electrode 214, and a molding member 240 surrounding the light emitting diode 100.

The body 205 may be formed to include a silicone material, a synthetic resin material or a metallic material, and an inclined surface may be formed around the light emitting diode 100.

The first lead electrode 213 and the second lead electrode 214 are electrically separated from each other and provide power to the light emitting diode 100. Also, first lead electrode 213 and the second lead electrode 214 may increase optical efficiency by reflecting light emitted from the light emitting diode 100 and may also serve to discharge heat generated from the light emitting diode 100 to an outside.

The light emitting diode 100 may be disposed on the body 205 or may be disposed on the first lead electrode 213 or the second lead electrode 214.

The light emitting diode 100 may be electrically connected with the first lead electrode 213 and the second lead electrode 214 in one of a wire method, a flip chip method and a die bonding method.

In the embodiment, the light emitting diode 100 may be mounted on the second lead electrode 214 and may be connected to the first lead electrode 213 by a wire 250 but is not limited thereto.

The molding member 240 may surround the light emitting diode 100 and may protect the light emitting diode 100. Also, a fluorescent body 232 may be included in the molding member 240 and may change a wavelength of the light emitted from the light emitting diode 100.

A plurality of light emitting diodes or light emitting diode packages according to the embodiment may be arrayed on a substrate, and optical members such as a lens, a light guide plate, a prism sheet and a diffusion sheet may be disposed on an optical path of the light emitting diode package. The light emitting diode passage, the substrate and the optical members may serve as a light unit. The light unit may be realized in a top view type or a side view type and may be provided at a display device such as a mobile terminal and a notebook computer or may be variously applied to a lighting device and an indicating device. A still another embodiment may be realized by the lighting device including the light emitting diode or the light emitting diode package according to the above-mentioned embodiments. For example, the lighting device may include a lamp, a street lamp, an electronic display board, a headlamp and so on.

Figure 8:
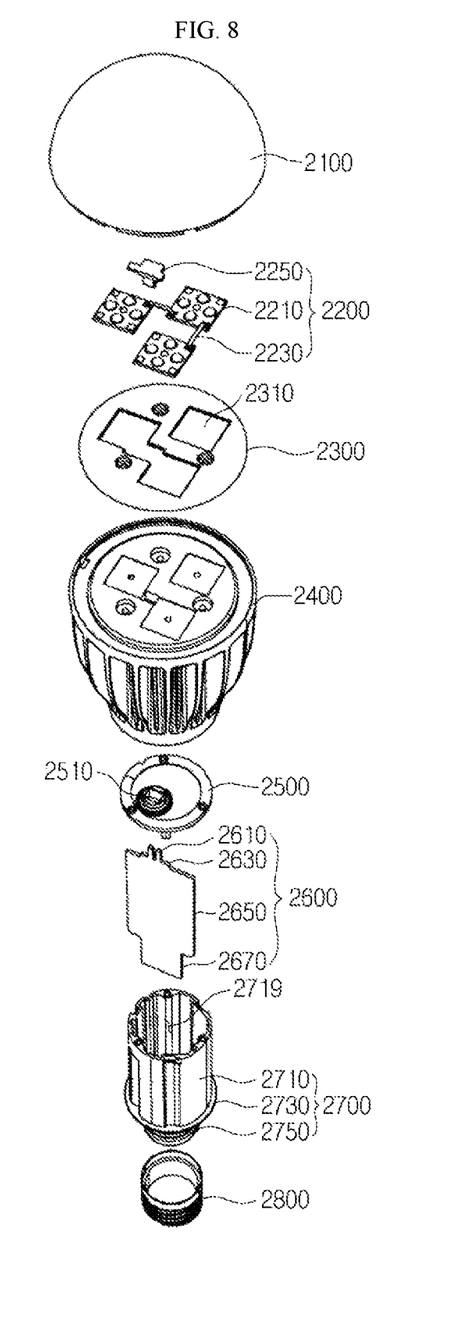
FIG. 8 is an exploded perspective view of a lighting device according to the embodiment.

FIG. 8 is an exploded perspective view of a lighting device according to the embodiment.

Referring to FIG. 8, the lighting device according to the embodiment may include a cover 2100, a light source module 2200, a heat sink 2400, a power supply 2600, an inner case 2700 and a socket 2800. Also, the lighting device according to the embodiment may further include one or more of a member 2300 and a holder 2500. The light source module 2200 may include the light emitting diode package according to the embodiment.

For example, the cover 2100 may be formed in a hollow bulb or hemispherical shape which is partially opened. The cover 2100 may be optically coupled to the light source module 2200. For example, the cover 2100 may diffuse, scatter or excite light provided from the light source module 2200. The cover 2100 may be a kind of optical members. The cover 2100 may be coupled to the heat sink 2400. The cover 2100 may have a coupling portion coupled to the heat sink 2400.

An inner surface of the cover 2100 may be coated with a milky paint. The milky paint may include a diffusion material for diffusing the light. A surface roughness of the inner surface of the cover 2100 may be formed greater than that of an outer surface of the cover 2100. This is to allow the light from the light source module 2200 to be sufficiently scattered and diffused and then to be discharged to an outside.

A material of the cover 2100 may be glass, plastic, polypropylene (PP), polyethylene (PE), polycarbonate (PC) or the like. Here, the PC has excellent light resistance, heat resistance and strength. The cover 2100 may be formed to be transparent, such that the light source module 2200 is allowed to be seen from an outside, or may be formed to be opaque. The cover 2100 may be formed through a blow-molding.

The light source module 2200 may be disposed at one surface of the heat sink 2400. Therefore, the heat from the light source module 2200 is transferred to the heat sink 2400. The light source module 2200 may include a light source part 2210, a connection plate 2230 and a connector 2250.

The member 2300 may be disposed on an upper surface of the heat sink 2400 and may have a plurality of light source parts 2210 and a guide groove 2310 in which the connector 2250 is inserted. The guide groove 2310 corresponds to a substrate of the light source parts 2210 and the connector 2250.

A surface of the member 2300 may be coated with a light reflecting material. For example, the surface of the member 2300 may be coated with a white paint. The member 2300 serves to reflect again the light, which is reflected by the inner surface of the cover 2100 and returned toward the light source module 2200, toward the cover 2100. Therefore, the optical efficiency of the lighting device according to the embodiment may be enhanced.

The member 2300 may be formed of, for example, an insulating material. The connection plate 2230 of the light source module 2200 may include an electro-conductive material. Therefore, the heat sink 2400 may come in electrical contact with the connection plate 2230. The member 2300 may be formed of the insulating material and may prevent an electrical short between the connection plate 2230 and the heat sink 2400. The heat sink 2400 serves to receive and discharge the heat from the light source module 2200 and the heat from the power supply 2600.

The holder 2500 blocks an accommodating groove 2719 of an insulating part 2710 of the inner case 2700. Therefore, the power supply 2600 accommodated in the insulating part 2710 of the inner case 2700 is sealed. The holder 2500 has a guide protrusion 2510. The guide protrusion 2510 has a hole through which a protruding portion 2610 of the power supply 2600 passes.

The power supply 2600 processes or converts an electric signal provided from an outside and provides the processed or converted electric signal to the light source module 2200. The power supply 2600 is accommodated in the accommodating groove 2719 of the inner case 2700 and sealed in the inner case 2700 by the holder 2500.

The power supply 2600 may include the protruding portion 2610, a guide portion 2630, a base 2650 and an extending portion 2670.

The guide portion 2630 has a shape which protrudes from one side of the base 2650 to an outside. The guide portion 2630 may be inserted into the holder 2500. A plurality of components may be disposed on one surface of the base 2650. For example, the plurality of components may include a direct current (DC) converter for converting alternating current (AC) power provided from an external power source into DC power, a driving chip for controlling driving of the light source module 2200, an electrostatic discharge (ESD) protection device for protecting the light source module 2200 and so on but are not limited thereto.

The extending portion 2670 has a shape which protrudes from another one side of the base 2650 to the outside. The extending portion 2670 is inserted into a connecting portion 2750 of the inner case 2700 and receives the electric signal from the outside. For example, the extending portion 2670 may be formed to be smaller than or equal to a width of the connecting portion 2750 of the inner case 2700. One end of each of a '+ wire' and a '− wire' may be electrically connected to the extending portion 2670, and the other end of each of the '+ wire' and the '− wire' may be electrically connected to the socket 2800.

The inner case 2700 may include a molding portion together with the power supply 2600 therein. The molding portion is a portion formed by hardening a molding liquid and allows the power supply 2600 to be fixed into the inner case 2700.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a variation are included in the scope of the present invention.

Embodiments are mostly described above. However, they are only examples and do not limit the present invention. A person skilled in the art may appreciate that several variations and applications not presented above may be made without departing from the essential characteristic of embodiments. For example, each component particularly represented in embodiments may be varied. In addition, it should be construed that differences related to such a variation and such an application are included in the scope of the present invention defined in the following claims.

The invention claimed is:

1. A light emitting diode comprising:
a first electrode having a plurality of patterns formed on an upper surface thereof;
a texture structure having a plurality of patterns corresponding to the plurality of patterns of the first electrode and configured to be in contact with at least one of the plurality of patterns of the first electrode;
a first conductive semiconductor layer disposed on the texture structure;
an active layer disposed on the first conductive semiconductor layer;
a second conductive semiconductor layer disposed on the active layer; and
a second electrode disposed on the second conductive semiconductor layer, and
wherein a width of the first electrode is smaller than a width of the texture structure.

2. The light emitting diode of claim 1, wherein both side ends of each of the plurality of patterns of the first electrode are overlapped with both side ends of each of the plurality of patterns of the texture structure, and both ends of the first electrode are disposed to be vertically overlapped with a lowermost surface of the texture structure,
wherein the first electrode contacts a portion of the texture structure.

3. The light emitting diode of claim 1, wherein the plurality of patterns of the first electrode are in contact with the first conductive semiconductor layer,
wherein a portion of an outmost side surface of the first electrode directly contacts a side surface of the texture structure.

4. The light emitting diode of claim 1, wherein the texture structure includes at least one of an aluminum gallium nitride layer and a gallium nitride layer.

5. The light emitting diode of claim 1, wherein the texture structure includes a superlattice layer in which an aluminum gallium nitride layer and a gallium nitride layer are stacked repeatedly.

6. The light emitting diode of claim 5, wherein a thickness of the aluminum gallium nitride layer is smaller than or equal to a thickness of the gallium nitride layer.

7. The light emitting diode of claim 5, wherein each of the aluminum gallium nitride layer and the gallium nitride layer has a thickness of 1 nm or more and 10 nm or less.

8. The light emitting diode of claim 5, wherein a composition ratio of aluminum in the aluminum gallium nitride layer is 2% or more and 15% or less.

9. The light emitting diode of claim 1, wherein each of the plurality of patterns of the first electrode has a triangular shape.

10. The light emitting diode of claim 1, wherein the texture structure has a thickness of 30 nm or more and 1500 nm or less.

11. The light emitting diode of claim 1, wherein a height of each of the plurality of patterns of the first electrode is 300 nm or more and 1500 nm or less.

12. The light emitting diode of claim 1, wherein each of the plurality of patterns of the first electrode has at least one of a triangular shape, a square shape and a trapezoidal shape.

13. The light emitting diode of claim 1, wherein the active layer emits ultraviolet light within a range of 360 nm or more and 400 nm or less.

14. A light emitting diode comprising:
a first electrode having a plurality of patterns formed on an upper surface thereof;
a texture structure having a plurality of patterns corresponding to the plurality of patterns of the first electrode, configured to be in contact with at least one of the plurality of patterns of the first electrode and including a superlattice layer in which an aluminum gallium nitride layer and a gallium nitride layer are stacked repeatedly;
a first conductive semiconductor layer disposed on the texture structure;
an active layer disposed on the first conductive semiconductor layer;
a second conductive semiconductor layer disposed on the active layer; and a second electrode disposed on the second conductive semiconductor layer, wherein the first electrode is simultaneously in contact with the aluminum gallium nitride layer and the gallium nitride layer, wherein a width of the first electrode is smaller than a width of the texture structure, wherein the first electrode contacts a portion of the texture structure, and wherein a portion of an outmost side surface of the first electrode directly contacts a side surface of the texture structure.

15. The light emitting diode of claim 14, wherein both side ends of each of the plurality of patterns of the first electrode are overlapped with both side ends of each of the plurality of patterns of the texture structure, and both ends of the first electrode are disposed to be vertically overlapped with a lowermost surface of the texture structure.

16. The light emitting diode of claim 14, wherein the plurality of patterns of the first electrode are in contact with the first conductive semiconductor layer.

17. The light emitting diode of claim 14, wherein a thickness of the aluminum gallium nitride layer is smaller than a thickness of the gallium nitride layer.

18. The light emitting diode of claim 14, wherein a thickness of the aluminum gallium nitride layer is equal to a thickness of the gallium nitride layer.

19. The light emitting diode of claim 14, wherein the texture structure has a thickness of 30 nm or more and 1500 nm or less.

20. A lighting system comprising a light emitting module having the light emitting diode of claim 1.

* * * * *